United States Patent
Abraham et al.

(10) Patent No.: US 9,520,547 B2
(45) Date of Patent: Dec. 13, 2016

(54) CHIP MODE ISOLATION AND CROSS-TALK REDUCTION THROUGH BURIED METAL LAYERS AND THROUGH-VIAS

(71) Applicant: International Business Machines Corporation, Armonk, NY (US)

(72) Inventors: David W. Abraham, Croton, NY (US); George A. Keefe, Cortlandt Manor, NY (US); Christian Lavoie, Pleasantville, NY (US); Mary E. Rothwell, Ridgefield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 15 days.

(21) Appl. No.: 13/838,261

(22) Filed: Mar. 15, 2013

(65) Prior Publication Data
US 2014/0274725 A1    Sep. 18, 2014

(51) Int. Cl.
*H01L 39/24* (2006.01)
*H01L 39/04* (2006.01)
(Continued)

(52) U.S. Cl.
CPC ............. *H01L 39/045* (2013.01); *B82Y 10/00* (2013.01); *G06N 99/002* (2013.01);
(Continued)

(58) Field of Classification Search
CPC .................................................. H01L 23/535
(Continued)

(56) References Cited

U.S. PATENT DOCUMENTS 5,075,655 A * 12/1991 Pond et al. .................. 333/238
5,168,078 A * 12/1992 Reisman et al. ............ 438/455
(Continued)

FOREIGN PATENT DOCUMENTS

WO    2012011230 A1    1/2012

OTHER PUBLICATIONS

PCT International Search Report and Written Opinion; International Application No. PCT/US 14/12694; International Filing Date: Jan. 23, 2014; Date of Mailing: May 7, 2014; pp. 1-20.
(Continued)

*Primary Examiner* — Eric Ward
(74) *Attorney, Agent, or Firm* — Cantor Colburn LLP; Vazken Alexanian

(57) ABSTRACT

A method for fabricating a chip surface base includes preparing a first substrate, preparing a plurality of vias in the first substrate, depositing metal fillings into the plurality of vias, preparing a second substrate, bonding the first and second substrates and exposing the metal fillings. A method for fabricating a chip surface base includes preparing a first and second substrate, depositing a metal on at least one of the first and second substrates, bonding the first and second substrates, preparing a plurality of vias in the first substrate, depositing metal fillings into the plurality of vias and exposing the metal fillings. A chip surface base device includes a first substrate, a second substrate, a metal layer disposed between the first and second substrates and a plurality vias disposed on the first substrate.

6 Claims, 4 Drawing Sheets

(51) Int. Cl.
*H01L 39/22* (2006.01)
*B82Y 10/00* (2011.01)
*G06N 99/00* (2010.01)
*H01L 23/538* (2006.01)
*H01L 27/18* (2006.01)

(52) U.S. Cl.
CPC .......... *H01L 23/5384* (2013.01); *H01L 27/18* (2013.01); *H01L 39/223* (2013.01); *H01L 39/2493* (2013.01); *H01L 2924/0002* (2013.01)

(58) Field of Classification Search
USPC ............... 257/31–36, 661–663, E21.142, E23.076,257/E23.156, E27.007, E29.142,257/E39.001–E39.02; 438/2, 455–459; 505/330
See application file for complete search history.

(56) References Cited

U.S. PATENT DOCUMENTS

| | | | |
|---|---|---|---|
| 5,485,029 A | 1/1996 | Crabbe et al. | |
| 5,611,008 A | 3/1997 | Yap | |
| 5,821,836 A | 10/1998 | Katehi et al. | |
| 5,990,768 A | 11/1999 | Takahashi et al. | |
| 6,130,483 A | 10/2000 | Shizuki et al. | |
| 6,258,715 B1 | 7/2001 | Yu et al. | |
| 6,479,139 B1* | 11/2002 | Claeson et al. | 428/216 |
| 6,589,802 B1 | 7/2003 | Asada et al. | |
| 6,674,347 B1 | 1/2004 | Maruhashi et al. | |
| 6,713,695 B2 | 3/2004 | Kawai et al. | |
| 6,844,236 B2* | 1/2005 | Ivanov et al. | 438/406 |
| 6,888,063 B1 | 5/2005 | Lien et al. | |
| 7,052,939 B2 | 5/2006 | Huang et al. | |
| 7,307,497 B2 | 12/2007 | Joodaki | |
| 7,400,222 B2 | 7/2008 | Kwon et al. | |
| 8,003,410 B2* | 8/2011 | Kerner | B82Y 10/00 365/162 |
| 8,125,058 B2 | 2/2012 | Mueller et al. | |
| 8,169,059 B2 | 5/2012 | Barth et al. | |
| 2001/0023943 A1 | 9/2001 | Zagoskin | |
| 2002/0158704 A1 | 10/2002 | Ye | |
| 2004/0173891 A1 | 9/2004 | Imai et al. | |
| 2005/0057327 A1 | 3/2005 | Kwon et al. | |
| 2005/0248421 A1 | 11/2005 | Joodaki | |
| 2009/0099025 A1* | 4/2009 | Uchaykin | 505/220 |
| 2010/0207236 A1 | 8/2010 | Hebras | |
| 2010/0224958 A1 | 9/2010 | Tiemeijer | |
| 2010/0225436 A1 | 9/2010 | Papavasilious et al. | |
| 2010/0241780 A1* | 9/2010 | Friesen | 710/305 |
| 2011/0175061 A1* | 7/2011 | Berkley et al. | 257/31 |
| 2012/0124432 A1 | 5/2012 | Pesetski et al. | |
| 2012/0319085 A1* | 12/2012 | Gambetta et al. | 257/31 |
| 2014/0264287 A1 | 9/2014 | Abraham et al. | |

OTHER PUBLICATIONS

S. Blanvillain et al., "Suppressing on-chip electromagnetic crosstalk for spin qubit devices," Journal of Applied Physics, vol. 112, Issue 6 , 2012, 064315, 6 pages.

J. S. Hamel et al., "Substrate crosstalk suppression capability of silicon-on-insulator substrates with buried ground planes (GPSOI)," IEEE Microwave and Guided Wave Letters, vol. 10, Issue 4, Apr. 2000, pp. 134-135.

M.-K. Kim, "Crosstalk control for microstrip circuits on PCBs at microwave frequencies," 1995 IEEE International Symposium on Electromagnetic Compatibility, Aug. 14-18, 1995, pp. 459-464.

David Abraham, et al., "Cross-Talk in Superconducting Transmon Quantum Computing Architecture," American Physical Society, APS March Meeting 2013, Abstract Only, p. 1-1.

Jay M. Gambetta, et al., "Characterization of Addressability by Simultaneous Randomized Benchmarking," Phys. Rev. Lett. 109, 240504, Dec. 11, 2012, pp. 1-10.

International Preliminary Report on Patentability for International Application No. PCT/US2014/012694; International Filing Date: Jan. 23, 2014; date of mailing: Sep. 24, 2015; 8 pgs.

* cited by examiner

CHIP MODE ISOLATION AND CROSS-TALK REDUCTION THROUGH BURIED METAL LAYERS AND THROUGH-VIAS

FEDERAL RESEARCH STATEMENT

This invention was made with Government support under Contract No.: W911NF-10-1-0324 awarded by the U.S. Army. The Government has certain rights in this invention.

BACKGROUND

The present invention relates to waveguides such as radio frequency (RF) structures, and more specifically, to RF structures for superconducting quantum computing circuits and chip mode isolation and cross-talk reduction implementing buried metal layers and through-vias.

Quantum computing using superconducting elements uses resonant structures such as coplanar waveguides and capacitively shunted Josephson junctions to store and manipulate information. These structures are built using conventional semiconductor manufacturing methods onto substrates such as Si wafers. A chip is diced out of a full wafer and then cooled and tested. This chip can support various resonant electromagnetic modes determined by the size (dimensions) of the chip. For chips in the several millimeter size range, these modes can be in the several GHz range, which is similar to the frequencies of the structures built on the chip and can therefore cause problems. RF structures used in superconducting quantum computing circuits need to be isolated from spurious resonant systems in order to maintain coherence, and in addition have to be isolated from other RF structures on the same chip. RF modes in the substrate itself can cause issues in this regard, both as a source of loss in the qubit (due to mode coupling), and also as an unintended conduction path between nominally separate structures.

Implementation of superconducting circuitry is seen as one of the strongest candidates to realize to enable quantum computing. The presence of chip modes is responsible for degradation of performance through the damping of qubit resonances and by the increase of crosstalk between circuit elements on-chip.

SUMMARY

Exemplary embodiments include a method for fabricating a chip surface base, the method including preparing a first substrate, preparing a plurality of vias in the first substrate, depositing metal fillings into the plurality of vias, preparing a second substrate, bonding the first and second substrates and exposing the metal fillings.

Additional exemplary embodiments include a method for fabricating a chip surface base, the method including preparing a first and second substrate, depositing a metal on at least one of the first and second substrates, bonding the first and second substrates, preparing a plurality of vias in the first substrate, depositing metal fillings into the plurality of vias and exposing the metal fillings.

Further exemplary embodiments include a chip surface base device, including a first substrate, a second substrate, a metal layer disposed between the first and second substrates and a plurality vias disposed on the first substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
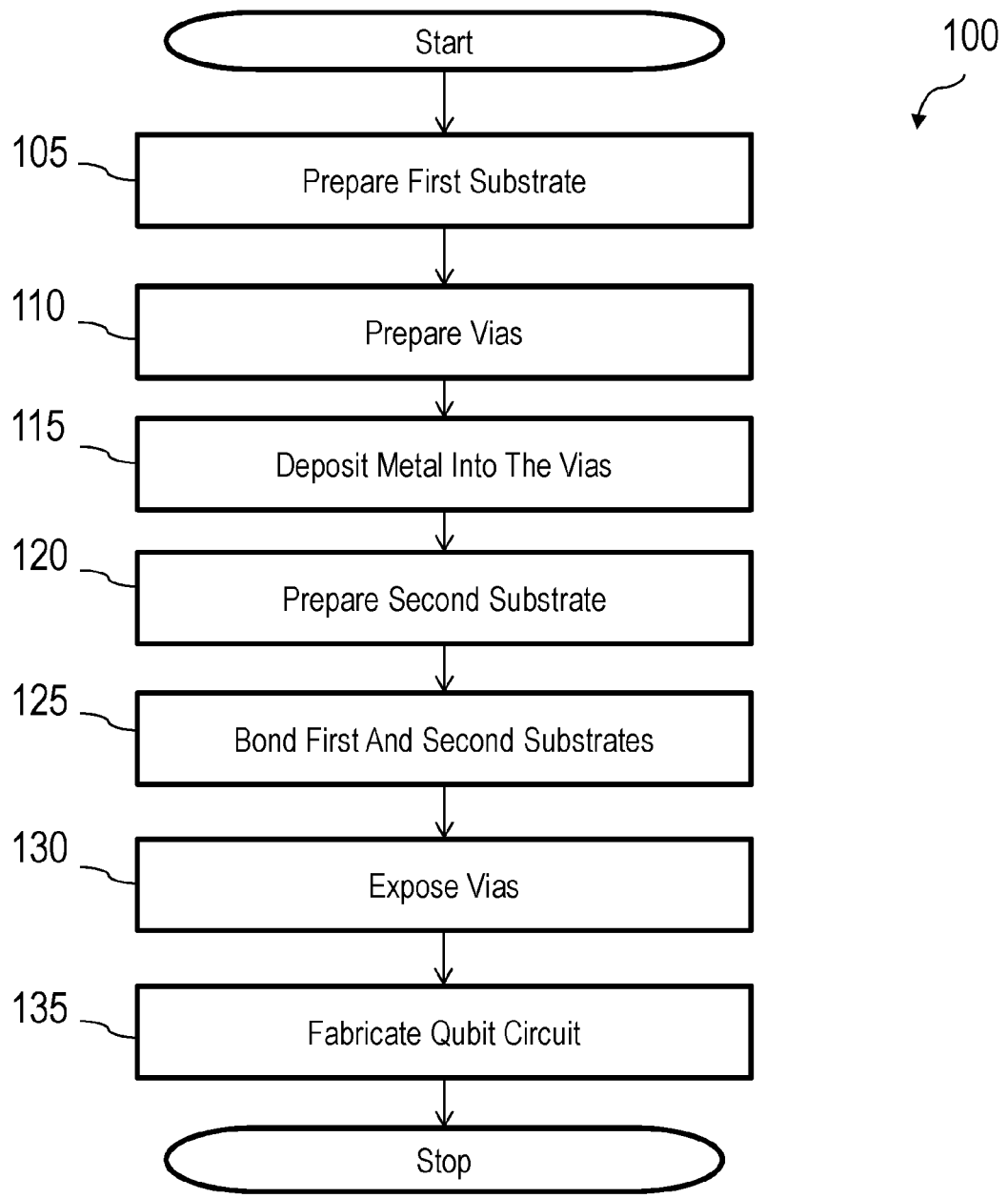
FIG. 1 illustrates a flowchart of a method for fabricating a base onto which qubit circuits can be manufactured.

In exemplary embodiments, the systems and methods described include wafer bonding to create buried metal layers and metallic through-vias. The systems and methods described herein are implemented to reduce or eliminate chip modes, and in addition can provide cross-talk isolation between RF structures. It has been determined that existing chip modes can be reduced or eliminated by either quenching the mode by building metallic structures into the chip in order to disrupt the mode, or by isolating the structures in a Faraday cage in order to shield the structures from the chip modes. Incorporation of dielectrics into the fabrication sequence can lead to reduction in the coherence time of the qubits and should be avoided, as further described herein.

As described herein, superconducting transmon quantum computing test structures often exhibit significant undesired cross-talk. For experiments with only a handful of qubits this cross-talk can be quantified and understood, and therefore corrected. As quantum computing circuits become more complex, and thereby contain increasing numbers of qubits and resonators, it becomes more vital that the inadvertent coupling between these elements is reduced or eliminated. The task of accurately controlling each single qubit to the level of precision required throughout the realization of a quantum algorithm is difficult by itself, but coupled with the need of nulling out leakage signals from neighboring qubits or resonators would quickly become impossible. For example in one realization of a superconducting qubit circuit used for quantum calculations, each qubit has four neighbors and operations between four different pairs. If there is poor isolation, then each qubit is potentially also talking to qubits one hop away, up to nine total qubits. In another example, each qubit is an oscillator with a resonating frequency, that ideally resonates indefinitely (i.e., has an ideal coherence). For the case in which crosstalk occurs via chip modes, this communication is not nearest neighbor, but rather is nonlocal so that qubits which are widely separated can communicate with each other. Correcting for this situation would quickly become intractable as the size of the quantum circuit increases. A second issue exists in that if the qubit communicates to chip modes, then each communication is an energy transfer that can de-phase or reduce amplitude of the resonant frequency (i.e., a reduction in $T_1$ and $T_2$). As such, there is a reduction in the coherence time of the qubit if it couples into a chip mode. In quantum computing, coherence times are preserved in order to perform proper calculations.

In exemplary embodiments, the systems and methods described herein address these issues by selectively placing vias having metal fillings that are coupled to a buried metal surface. The locations of the vias are selected based on where modes of a subsequently fabricated qubit circuit will reside on a surface of the substrate in which the vias are disposed. In exemplary embodiments, modeling of the qubit circuit enables selection of locations of the vias. In operation, when the qubit circuit couples to chip modes, the modes conduct into the metal fillings and are shorted into the buried metal surface. Thus the modes are killed. In exemplary embodiments, the modes have wavelengths longer than distances between the vias. In exemplary embodiments, the locations of the vias can also be selected to isolate individual devices in the qubit circuit, thereby placing vias around the devices so that modes are kept isolated between the vias and then shorted to the buried metal layer.

Several embodiments of implementation of metallic through-vias coupled with buried metal ground planes can be implemented to both quench chip modes and to isolate RF components from these modes. The systems and methods described herein provide improvement in qubit coherence as well as increased cross-talk immunity for RF devices on the chip. By implementing wafer bonding to create a buried metal layer, advantages of via methods are obtained with ground backplane to isolate key circuit components and in addition other advantages are opened up as well including the ability to pattern the back metal layer (BML) and also incorporate structures into the second wafer which can be used for addressing RF structures. Several embodiments are now described.

Figure 2:
FIG. 2 illustrates a first substrate.

FIG. 1 illustrates a flowchart of a method 100 for fabricating a chip-surface base onto which qubit circuits can be manufactured. The base provides chip mode isolation and cross-talk reduction through buried metal layers and through-vias. FIG. 2 illustrates a first substrate 200. At block 105, the first substrate 200 is prepared for processing. In exemplary embodiments, the first substrate 200 is selected to reduce dielectric loss tangent at low temperatures. The first substrate 200 is also selected to be a material which can be etched selectively to the superconducting and dielectric material to be used for subsequent qubit circuit fabrication. For example, high resistivity Si wafers may be implemented.

Figure 3:
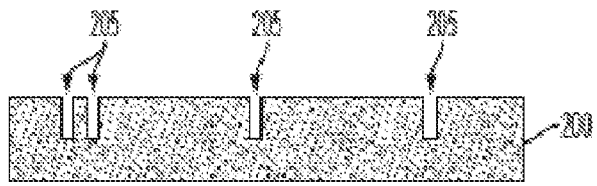
FIG. 3 illustrates the substrate with etched vias.

FIG. 3 illustrates the substrate 200 with etched vias 205. At block 110, the vias 205 are etched into the substrate. Any suitable photolithography techniques can be implemented to pattern the vias 205. In addition, any suitable etching techniques can be implemented including, but not limited to, Plasma-Enhanced Chemical Vapor Deposition (PECVD) for insulator deposition. For example, a Reactive Ion Etching (RIE) for etching samples and spinners to coat silicon chips and wafers with lithographic resist may be used. In addition, any etch alignment features for latter processing can be performed at block 110.

Figure 4:
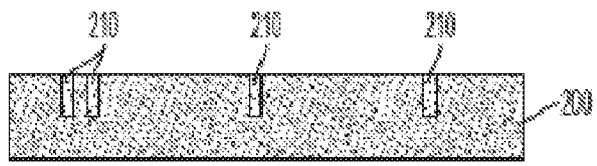
FIG. 4 illustrates vias filled with metal fillings.

FIG. 4 illustrates the vias 205 filled with metal fillings 210 (e.g., a superconducting material such as but not limited to aluminum (Al)). At block 115, the metal fillings 210 are deposited into the vias 205. In exemplary embodiments, the lengths of the metal fillings 210 are in the range of 50-160 microns. The first substrate can be polished to ensure a flush surface and that the metal fillings 210 are exposed.

Figure 5:
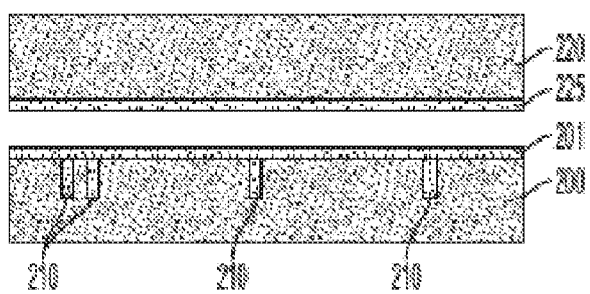
FIG. 5 illustrates the first substrate of FIG. 1 with metal fillings and a second substrate.

FIG. 5 illustrates the first substrate 200 with metal fillings 210 and a second substrate 220. In exemplary embodiments, a metal layer 225 can be deposited on the second substrate 220. A metal layer 201 can also be deposited on the first substrate 200 over the metal fillings 210. At block 120, the second substrate 220 is prepared. In exemplary embodiments, the second substrate 220 is selected to reduce dielectric loss tangent at low temperatures. For example, high resistivity Si wafers may be implemented. The second substrate 220 is also selected to be a material which can be etched selectively to the superconducting and dielectric material to be used for subsequent qubit circuit fabrication. As described herein metal layers 201, 225 can be deposited on one or both of the first and second substrates 200, 200 respectively. The metal layers 201, 225 are preferably the same material as the metal fillings 210.

Figure 6:
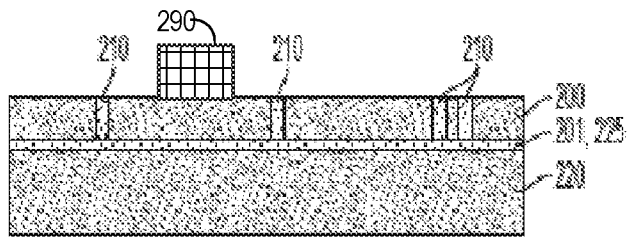
FIG. 6 illustrates the first and second substrates of FIGS. 1-5, bonded to one another.

FIG. 6 illustrates the first and second substrates 200, 220 bonded to one another. At block 125 the first and second substrates 200, 220 are bonded together with a low-temperature anneal. At block 130, the surface of the first substrate 200 is polished to fully expose the vias. Subsequent fabrication, shone at block 135, includes fabricating a qubit circuit 290 atop the first substrate, along with other resonators and top metallization. As described herein, the metal fillings 210 are positioned with the subsequent qubit circuit 290 in mind, and placed where the modes of the qubit circuit will reside. In this way, the metal fillings 210 conduct the modes and short the modes to the now buried metal layers 201, 225, thereby suppressing the modes from leaking to other qubit circuits.

Figure 7:
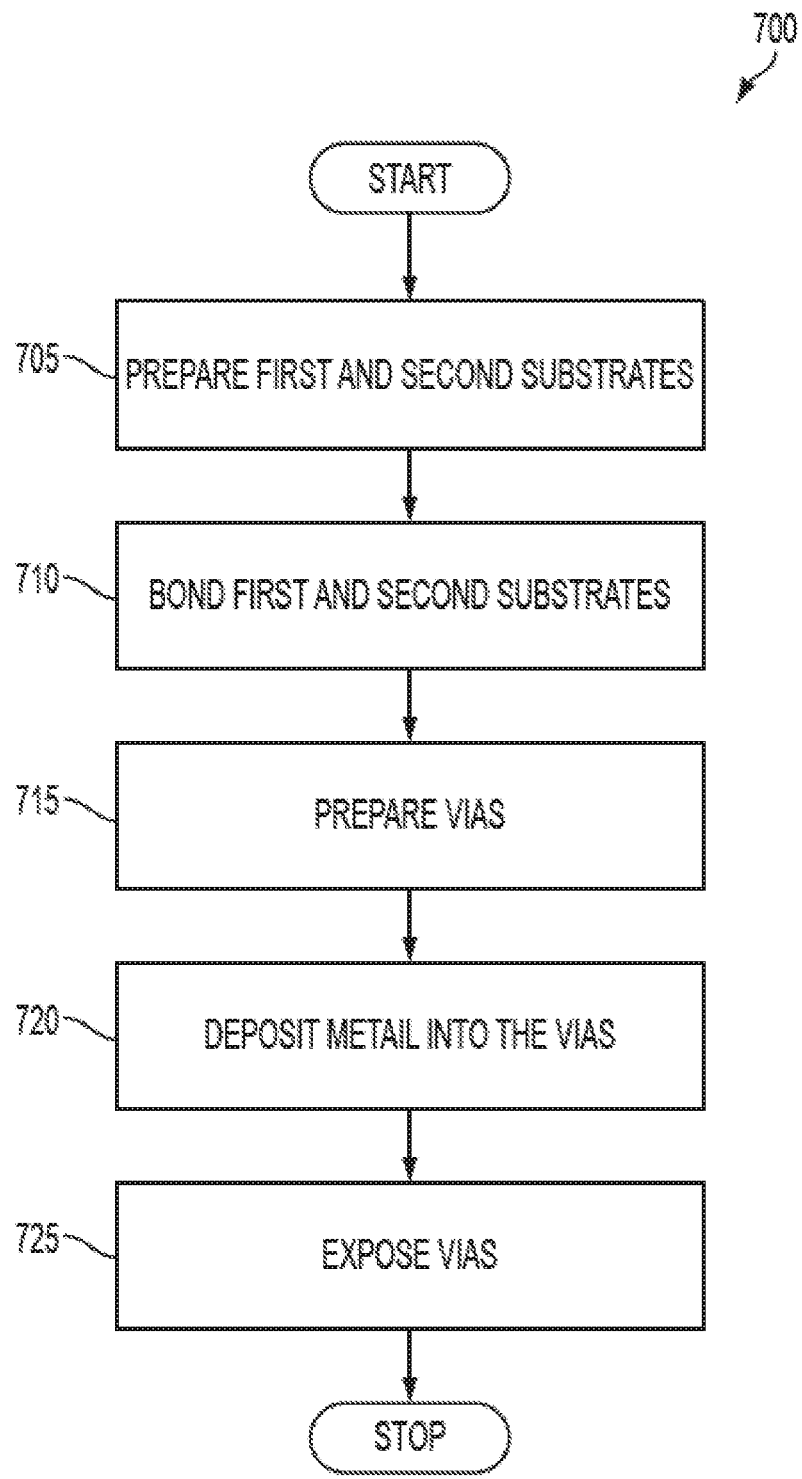
FIG. 7 illustrates a flowchart of another method for fabricating a base onto which qubit circuits can be manufactured.
Figure 8:
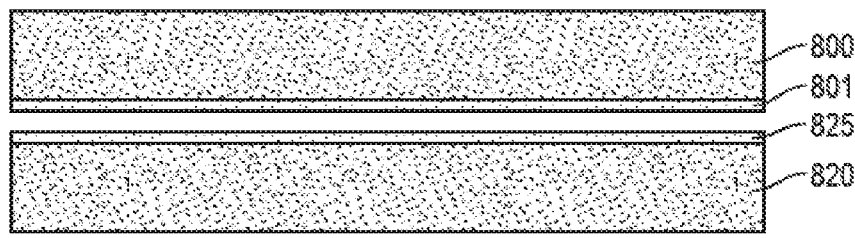
FIG. 8 illustrates a first and second substrate.

FIG. 7 illustrates a flowchart of another method 700 for fabricating a chip surface base onto which qubit circuits can be manufactured. The base provides chip mode isolation and cross-talk reduction through buried metal layers and through-vias. FIG. 8 illustrates a first and second substrate 800, 820. At block 705, the first and second substrates 800, 820 are prepared for processing. In exemplary embodiments, the first and second substrates 800, 820 are selected to reduce dielectric loss tangent at low temperatures. The first and second substrates 800, 820 are also selected to be a material which can be etched selectively to the superconducting and dielectric material to be used for subsequent qubit circuit fabrication. For example, high resistivity Si wafers may be implemented. In exemplary embodiments, metal layers 801, 825 can be deposited on the first and second substrates 800, 820 respectively. As described herein metal layers 801, 825 can be deposited on one or both of the first and second substrates 800, 820 respectively.

Figure 9:
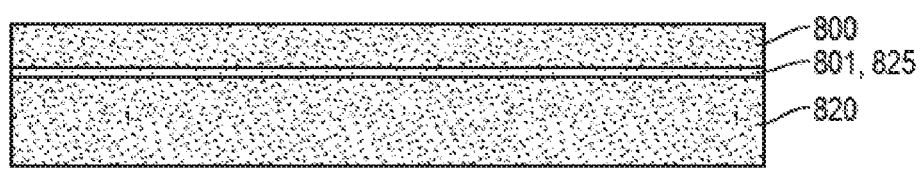
FIG. 9 illustrates the first and second substrates of FIG. 8 bonded to one another.

FIG. 9 illustrates the first and second substrates 800, 820 bonded to one another. At block 710 the first and second substrates 800, 820 are bonded together with a low-temperature anneal.

Figure 10:
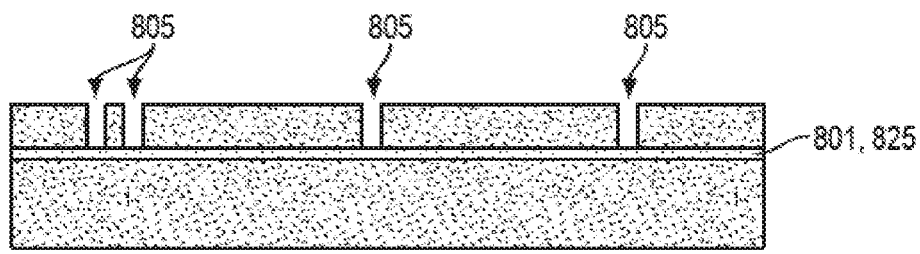
FIG. 10 illustrates a substrate with etched vias.

FIG. 10 illustrates the substrate 800 with etched vias 805. At block 715, the vias 805 are etched into the substrate. Any suitable photolithography techniques can be implemented to pattern the vias 805. In addition, any suitable etching techniques can be implemented including, but not limited to, Plasma-Enhanced Chemical Vapor Deposition (PECVD) for insulator deposition. For example, a Reactive Ion Etching (RIE) for etching samples and spinners to coat silicon chips and wafers with lithographic resist may be used. In addition, any etch alignment features for latter processing can be performed at block 715.

Figure 11:
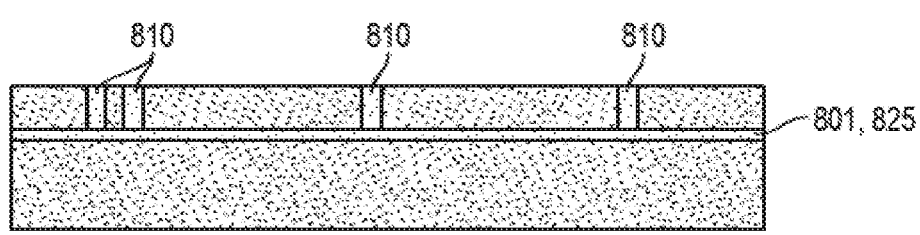
FIG. 11 illustrates vias filled with metal fillings.

FIG. 11 illustrates the vias 805 filled with metal fillings 810 (e.g., a superconducting material such as but not limited to aluminum and preferably the same material as the metal layers 801, 825). At block 720, the metal fillings 810 are deposited into the vias 805. In exemplary embodiments, the lengths of the metal fillings 810 are in the range of 50-160 microns.

At block 725, the surface of the first substrate 800 is polished to fully expose the vias. Subsequent fabrication includes fabricating a qubit circuit atop the first substrate, along with other resonators and top metallization. As described herein, the metal fillings 810 are positioned with the subsequent qubit circuit in mind, and placed where the modes of the qubit circuit will reside. In this way, the metal fillings 810 conduct the modes and short the modes to the now buried metal layers 801, 825, thereby suppressing the odes from leaking to other qubit circuits.

It can be appreciated that an implementation of a combination of buried metal layers with connected vias form isolation cage for RF structures on chip surface. The systems and methods described herein have an absence of dielectrics in buried layers which prevent a reduction in coherence times. Additional layers can be implemented to allow bonding (i.e., adhesion layers). All metallization procedures described herein are patterned in order to isolate grounds and prevent mode coupling between devices.

The methods described herein can include RIE endpointing on Al coatings. In addition, the methods can include incorporation of wiring and structures into the bonding substrate wafer. This can be used for wiring between structures and provide access to the RF structures on the primary wafer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a chip surface base, the method comprising:
    preparing a first substrate;
    forming a plurality of vias in a top surface of the first substrate;
    depositing metal fillings into the plurality of vias;
    forming a first metal layer on the top surface of the first substrate and in contact with the plurality of vias;
    preparing a second substrate;
    forming a second metal layer on a top surface of the second substrate;
    bonding the first and second substrates at the first and second metal layers so as to form a bonded, buried metal layer;
    polishing a bottom surface of the first substrate so as to expose the metal fillings, wherein the resultant structure comprises the first substrate contacting the first metal layer, the second substrate contacting the second metal layer and the first metal layer contacting the second metal layer; and
    etching the first and second substrates to fabricate a qubit circuit;
    fabricating a qubit circuit, wherein the qubit circuit is on the first substrate and is coupled to a plurality of chip modes, the plurality of chip modes operative to conduct into the metal fillings deposited into the plurality of vias and define a short into the metal layer between the second substrate and the first substrate, wherein the plurality of chip modes have wavelengths longer than distances between vias in the plurality of vias; and
    wherein the plurality of vias is arranged in a location on the first substrate such that the plurality of vias isolates the plurality of chip modes between the plurality of vias and the metal layer between the second substrate and the first substrate.

2. The method as claimed in claim 1, further comprising: selecting the first and second substrates to reduce dielectric loss tangent at superconducting temperatures.

3. The method as claimed in claim 1, wherein the plurality of vias is etched into the top surface of the first substrate.

4. The method as claimed in claim 3, further comprising: selecting locations of vias on the top surface of the first substrate to correspond to mode locations of the fabricated qubit circuit.

5. The method as claimed in claim 1, wherein the first and second metal layers are a same material as the metal fillings.

6. The method as claimed in claim 5, wherein the first and second metal layers and the metal fillings are a superconducting material.

* * * * *